US006960485B2

(12) United States Patent
Uemura et al.

(10) Patent No.: US 6,960,485 B2
(45) Date of Patent: Nov. 1, 2005

(54) LIGHT-EMITTING DEVICE USING A GROUP III NITRIDE COMPOUND SEMICONDUCTOR AND A METHOD OF MANUFACTURE

(75) Inventors: Toshiya Uemura, Aichi (JP); Naohisa Nagasaka, Aichi (JP); Masaki Hashimura, Aichi (JP); Atsuo Hirano, Aichi (JP); Hiroshi Tadano, Aichi (JP); Tetsu Kachi, Aichi (JP); Hideki Hosokawa, Aichi (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 10/375,135

(22) Filed: Feb. 28, 2003

(65) Prior Publication Data

US 2003/0151058 A1 Aug. 14, 2003

Related U.S. Application Data

(62) Division of application No. 09/819,952, filed on Mar. 29, 2001.

(30) Foreign Application Priority Data

Mar. 31, 2000 (JP) ........................................ 2000-96495

(51) Int. Cl.[7] ................................................ H01L 21/00
(52) U.S. Cl. ............................................ 438/33; 438/29
(58) Field of Search .............................. 438/22, 26, 28, 438/29, 31, 33, 34, 42, 43, 46, FOR 157, 116, FOR 287

(56) References Cited

U.S. PATENT DOCUMENTS

| | | | | |
|---|---|---|---|---|
| 5,798,537 A | | 8/1998 | Nitta | |
| 6,033,927 A | * | 3/2000 | Shibata et al. | 438/33 |
| 6,100,545 A | | 8/2000 | Chiyo et al. | |
| 6,121,636 A | | 9/2000 | Morita et al. | |
| 6,222,207 B1 | | 4/2001 | Carter-Coman et al. | |
| 6,229,160 B1 | | 5/2001 | Krames et al. | |
| 6,291,839 B1 | | 9/2001 | Lester | |
| 6,468,902 B2 | | 10/2002 | Kawai | |

FOREIGN PATENT DOCUMENTS

| | | | | |
|---|---|---|---|---|
| GB | 2333899 | | 8/1999 | |
| JP | 51-137393 | | 11/1976 | |
| JP | 5-129658 | | 5/1993 | |
| JP | 09-219560 | | 8/1997 | |
| JP | 10-270754 | | 10/1998 | |
| JP | 10308532 A | * | 11/1998 | H01L/33/00 |
| JP | 11-126924 | | 5/1999 | |
| JP | 11-126925 | | 5/1999 | |
| JP | 11-186598 | | 7/1999 | |
| JP | 11-220168 | | 8/1999 | |
| JP | 11-261112 | | 9/1999 | |
| JP | 11-126923 | | 11/1999 | |

OTHER PUBLICATIONS

Japanese Office Action dated Mar. 29, 2005, with partial English translation.

* cited by examiner

*Primary Examiner*—Tom Thomas
*Assistant Examiner*—N. Drew Richards
(74) *Attorney, Agent, or Firm*—McGinn & Gibb, PLLC

(57) ABSTRACT

A process of forming separation grooves for separating a semiconductor wafer into individual light-emitting devices, a process for thinning the substrate, process for adhering the wafer to the adhesive sheet to expose a substrate surface on the reverse or backside of the wafer, a scribing process for forming split lines in the substrate for dividing the wafer into light-emitting devices, and a process of forming a mirror structure comprising a light transmission layer, a reflective layer, and a corrosion-resistant layer, which are laminated in sequence using sputtering or deposition processes. Because the light transmission layer is laminated on the adhesive sheet, gases normally volatilized from the adhesion materials are sealed and do not chemically combine with the metal being deposited as the reflective layer. As a result, reflectivity of the reflective layer can be maintained.

2 Claims, 13 Drawing Sheets

FIG. 9

[LUMINOUS INTENSITY MAINTENANCE RATE (%)]

| | | LUMINOUS INTENSITY MAINTENANCE | |
|---|---|---|---|
| | | CONDITION 1 | CONDITION 2 |
| ITEMS FOR SETTING CONDITIONS | TIME FOR APPLYING ELECTRICITY | 500 [hr] | 500 [hr] |
| | QUANTITY OF CURRENT (CURRENT VALUE) | 30 [mA] | 30 [mA] |
| | TEMPERATURE | 25 [°C] | 100 [°C] |
| LUMINOUS INTENSITY MAINTENANCE RATE | LIGHT-EMITTING DEVICE 100 | 90~100 (%) | 90~100 (%) |
| | LIGHT-EMITTING DEVICE 900 | 65~ 75 (%) | 60~ 70 (%) |

LIGHT-EMITTING DEVICE USING A GROUP III NITRIDE COMPOUND SEMICONDUCTOR AND A METHOD OF MANUFACTURE

The present Application is a Divisional Application of U.S. patent application Ser. No. 09/819,952 filed on Mar. 29, 2001.

This is a patent application based on a Japanese patent application No. 2000-96495 which had been filed on Mar. 31, 2000.

BACKGROUND OF THE INVENTION

1. Field of the Invention

The present invention relates to a light-emitting device using a group III nitride compound semiconductor and a method for manufacturing such a device. In particular, the present invention relates to the structure of a mirror structure formed on the reverse side of a substrate and a method for forming the mirror structure.

2. Description of the Related Art

A variety of light-emitting devices using group III nitride compound semiconductor comprising a mirror structure formed on the reverse side or backside of a substrate and a variety of methods for manufacturing such devices are generally known in the art. For example, Japanese patent Application Laid-Open (kokai) No. 11-126924 (Title: "Method of manufacturing gallium nitride compound semiconductor element") (hereinafter referred to as Reference 1), Japanese Patent Application Laid-Open No. 11-126925 (hereinafter referred to as Reference 2), Japanese Patent Application Laid-Open No. 5-129658 (hereinafter referred to as Reference 3), and Japanese Patent Application Laid-Open No. 11-261112 (hereinafter referred to as Reference 4) disclose other such LEDs.

FIG. 14 shows a cross-sectional view of a conventional light-emitting semiconductor device 900 using a group III nitride compound semiconductor of the type disclosed in the aforementioned Reference 1.

A sapphire substrate 11 is formed into an approximately square shape. A buffer layer 12 and an n-type contact layer 13 (hereinafter alternatively referred to as "a high carrier concentration $n^+$-layer 13" or "an $n^+$-layer 13") are then sequentially formed on the substrate 11. An n-type clad layer 14 is then formed on the high carrier concentration $n^+$-layer 13.

An emission layer 15 having a multiple quantum well (MQW) structure comprising a plurality of alternating barrier layers 151 and well layers 152 is then formed on the n-type clad layer 14. A p-type clad layer 16 is then formed on the emission layer 15 and a p-type contact layer 17 is formed on the p-type clad layer 16.

A positive electrode 18A which transmits light is formed on the p-type contact layer 17. The positive electrode 18A comprises a first thin-film metal layer which is adjacent to the contact layer 17 and a second thin-film metal layer which is adjacent to the first thin-film metal layer. A negative electrode 18B, which is formed on the $n^+$-layer 13, comprises a plurality of metal film each film having a multiple layer structure. A metal electrode pad 20 is then formed on a portion of the positive electrode 18A.

On the reverse side of the substrate 11 (sapphire substrate 11), a metal layer 90 (mirror structure 90) consisting of about 200 nm of aluminum (Al) is then formed.

Generally, a sapphire substrate is hard. In order to divide a semiconductor wafer precisely, therefore, separation grooves or split lines (also referred to as scribe lines) are formed on both the semiconductor side and the reverse side of the substrate after forming the electrodes.

When split lines are formed on the electrode side (upper side) of the semiconductor wafer, the substrate is still required to maintain a certain mechanical strength. A certain thickness of the substrate is preferred, typically about several hundred microns ($\mu$m). Then, in order to separate the individual light-emitting semiconductor devices properly, the substrate is polished to further reduce its thickness. The split lines are then scribed on the reverse side, or the polished surface, of the substrate.

In the conventional manufacturing processes, however, leave two significant problems unsolved. As a result, the mass production, sale, and use of such light-emitting devices using group III nitride compound semiconductor and including a reflective metal layer has not been easy.

The first problem relates to the formation of the split lines.

Before forming the metal layer on the reverse side of the substrate, it is necessary to form split lines (scribe lines) on the reverse side of the semiconductor wafer or substrate.

This is because scribing cutters are typically formed from small grains of diamond shaped into a blade. Because the blade of such a scribing cutter will tend to be clogged by any metal layer laminated on the reverse side of the substrate, the split lines cannot be formed after the metal layer is formed.

Further, the scribing cutter must be positioned precisely to cut only the predetermined regions. However, a metal layer formed on the surface to be cut would hinder the positioning. To solve this problem, the conventional method, i.e., not forming the metal layer on predetermined regions of the reverse side of the substrate used for positioning, as disclosed in the above-mentioned references, may be used. By using such a conventional method, however, semiconductor light-emitting devices are formed without the necessary metal layer to form the mirror structure. Because these devices cannot be commercialized, a portion of the wafer is wasted and production efficiency is reduced.

Yet another problem associated with the conventional scribing process is that a semiconductor wafer being scribed is typically fixed to an adhesive sheet. When the metal layer is being formed on the reverse side of the substrate, a portion of the sheet materials, in particular the adhesive, tends to volatilize and release abundant and undesirable gases during the deposition of the metal layer. Because these gases interact chemically with the deposited or sputtered metals, the reflectivity and affinity (adhesion) of the resulting metal layer to the substrate can be significantly lowered.

Another significant problem relates to the corrosion resistance of the resulting mirror structure.

When adhesives (such as paste materials including silver are used to bond the mirror structure of the light-emitting device to other structures such as leadframes, submounts, and stem contacts, the resulting alloying and oxidation effects can cause the metal layer to deteriorate and, as a result, lower the reflectivity of the mirror structure.

The reflective layer of the light-emitting device may also be damaged during and/or after the scribing and separation processes. When the reflection layer is too severely damaged, quantity of reflected light will decrease and the reflective layer may be partially or completely peeled off (delamination).

SUMMARY OF THE INVENTION

The present invention overcomes each of the aforementioned problems as well as other problems. Thus, an object of the present invention is to provide a structure for and a method of constructing a light-emitting device which has an increased luminous output and a longer performance life that can be mass-produced at comparatively low cost.

In order to solve the above-noted problems, a first object of the present invention is to provide a light-emitting semiconductor device comprising plural semiconductor layers comprising group III nitride compound semiconductors that are laminated onto a substrate by crystal growth, and an improved mirror structure. The mirror structure is formed by laminating a light transmission layer and a reflective layer on the reverse side of the substrate, i.e., the side of the substrate opposite the emission layer. The light transmission layer may be formed from a variety of metal oxides and ceramic materials having sufficient luminous transparency. The reflective layer preferably consists of one or more metals and reflects light emitted from the emission layer.

A second object of the present invention is to provide a light-emitting semiconductor device comprising plural semiconductor layers, comprising group III nitride compound semiconductors that are laminated onto a substrate by crystal growth, and a mirror structure. The mirror structure is formed by laminating a reflective layer, which comprises metals and reflects light emitted from the emission layer, and a corrosion-resistant layer, which comprises at least a metal oxide or a ceramic material.

A third object of the present invention is to laminate a corrosion-resistant layer comprising a metal oxide or a ceramic material having luminous transparency over the operative layers, including the light transmission layer and the reflective layer that forms the mirror structure.

A fourth object of the present invention is to form the reflective layer by using at least one metal selected from aluminum (Al), silver (Ag), or one of their alloys.

A fifth object of the present invention is that a thickness of the reflective layer is within a range of between 5 nm and 20 $\mu$m.

A sixth object of the present invention is to form the light transmission layer by using metal oxides and oxides having luminous transparency, such as $Al_2O_3$, $TiO_2$, MgO, $MgCO_3$, $Ta_2O_5$, ZnO, $In_2O_3$, $SiO_2$, $SnO_2$, and $ZrO_2$.

A seventh object of the present invention is to provide a light transmission layer having a thickness within a range of between 5 nm and 10 $\mu$m.

An eighth object of the present invention is to form the corrosion-resisting layer by using at least one metal oxide or oxide, such as $Al_2O_3$, $TiO_2$, MgO, $MgCO_3$, $Ta_2O_5$, ZnO, $In_2O_3$, $SiO_2$, $SnO_2$, or $ZrO_2$, a metal carbide, a metal nitride, or a metal boride that is corrosion resistant.

A ninth object of the present invention is to provide a corrosion-resisting layer having a thickness that is within a range of between 5 nm and 10 $\mu$m.

A tenth object of the present invention is to provide a substrate that comprises sapphire and has a thickness within a range of between 75 $\mu$m and 150 $\mu$m.

An eleventh object of the present invention is to form the reflection layer by using at least one metal such as rhodium (Rh), ruthenium (Ru), platinum (Pt), gold (Au), copper (Cu), palladium (Pd), chromium (Cr), nickel (Ni), cobalt (Co), titanium (Ti), indium (In), molybdenum (Mo), or an alloy of at least one of these metals.

A twelfth object of the present invention is to provide a reflective layer that has a multiple layer structure comprising plural metal layers.

A thirteenth object of the present invention is to provide a method for manufacturing the light-emitting device using a group III nitride compound semiconductor described above that further comprises a process of forming a mirror structure including the steps of sequentially laminating a light transmission layer, and/or a reflective layer, and/or a corrosion-resistant layer on the reverse side of substrate, i.e., the side opposite the plural semiconductor layers.

A fourteenth object of the present invention is to provide a method for manufacturing the light-emitting device further comprising a process for breaking the semiconductor wafer into individual light-emitting semiconductor devices.

A fifteenth object of the present invention is to provide a method for manufacturing the light-emitting device further comprising the following sequence of steps a process for forming separation grooves to separate the semiconductor wafer into individual of light-emitting semiconductor devices by cutting the electrode side of the wafer to a predetermined depth; a lamellar process for grinding or polishing the substrate to a predetermined thickness; an adhesion process for adhering the semiconductor wafer to an adhesive sheet so that the reverse side of the semiconductor wafer is exposed for processing; a scribing process for scribing the split lines on the reverse side of the semiconductor wafer to divide the wafer into individual light-emitting semiconductor devices; and the process for forming the mirror structure.

Accordingly, above described problems can be solved by utilizing of these processes.

BRIEF DESCRIPTION OF THE DRAWING

FIG. 9 is a table showing characteristics of a light-emitting device 100 using a group III nitride compound semiconductor which was separated from a semiconductor wafer corresponding to water 201 in FIG. 5 by a breaking process in accordance with the first embodiment of the present invention;

DETAILED DESCRIPTION OF THE PREFERRED EMBODIMENT

Figure 1:
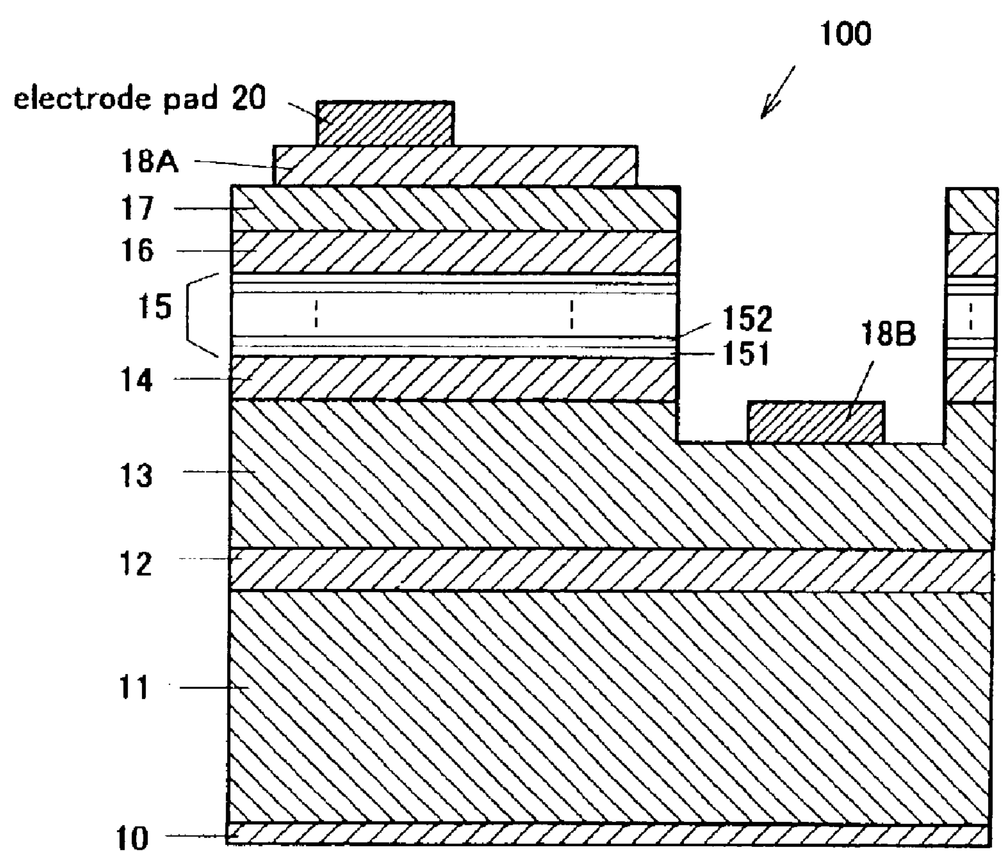
FIG. 1 is a cross-sectional view of a light-emitting device 100 using a group III nitride compound semiconductor of the present invention.

The present invention will now be described by way of specific embodiments.

In the present invention, by forming the light transmission layer which comprises at least one metal oxide or ceramic having sufficient luminous transparency between the substrate and the reflective layer, gases volatilized from the adhesive sheet can be controlled. As a result, the reflectivity of the reflective layer can be maintained at a high level.

By forming a corrosion-resistant layer comprising at least one metal oxide or ceramic material having luminous transparency on the top of the layers formed in the mirror structure, the problem of corrosion resistance of the mirror structure can be solved. That is because the corrosion-resistant layer can protect the reflective layer. The corrosion-resistant layer is preferably formed by using a material which is not easily alloyed with the reflection layer and has mechanical strength, hardness, and corrosion resistance. More preferably, the material can be easily and firmly bonded to materials such as leadframe, submount, or stem using solder. Considering these conditions, the corrosion-resistant layer preferably comprises a material such as at least one metal oxide or ceramic material.

By forming the reflective layer using at least one metal selected from aluminum (Al), silver (Ag), and their alloys, the reflectivity of the reflective layer is extremely high.

The thickness of the reflective layer is preferably in a range between 5 nm and 20 μm. Although it may depend on the kinds of metals constituting the layer, the thickness of the reflective layer is more preferably in a range between 30 nm and 1000 nm, and most preferably in a range between 50 nm and 500 nm. When the reflective layer is too thin, its reflectivity is reduced. When the reflective layer is too thick, too much metal material, processing time and other resources, are required to form the layer, thereby unnecessarily increasing the cost of forming the reflective layer.

The light transmission layer is formed by using at least one oxide having luminous transparency such as $Al_2O_3$, $TiO_2$, MgO, $MgCO_3$, $Ta_2O_5$, ZnO, $In_2O_3$, $SiO_2$, $SnO_2$, and $ZrO_2$.

The thickness of the light transmission layer is preferably in a range of 5 nm to 10 μm. Although it may depend on the kinds of materials used to form the layer, the thickness of the light transmission layer is more preferably in a range between 10 nm and 500 nm, and most preferably in a range between 20 nm and 300 nm. When the light transmission layer is too thin, its ability to adhere to the substrate is reduced. When the layer is too thick, its luminous transparency decreases accordingly and too much material processing time and other resources are required to form the layer, thereby unnecessarily increasing the cost of forming and reducing the performance of the light transmission layer.

The corrosion-resistant layer is formed by using at least one material having corrosion resistivity such as an oxide selected from $Al_2O_3$, $TiO_2$, MgO, $MgCO_3$, $Ta_2O_5$, ZnO, $In_2O_3$, $SiO_2$, $SnO_2$, and $ZrO_2$, or a metal carbide, a metal nitride, or a metal boride.

The thickness of the corrosion-resistant layer is preferably in range between 5 nm and 10 μm. Although it may depend on the materials used to form the layer, the thickness of the corrosion-resistant layer is more preferably in a range between 30 nm and 500 nm, and most preferably in a range between 50 nm and 300 nm. When the corrosion-resistant layer is too thin, the corrosion resistance of the mirror structure is reduced. When the layer is too thick, too much material, processing time and other resources are required to form the layer, thereby unnecessarily increasing the cost of forming the corrosion-resistant layer.

By forming the substrate comprising sapphire to a thickness in a range between 75 μm and 150 μm, the individual semiconductor devices can be divided without forming unnecessary non-functional devices resulting from the scribing process used to draw split lines (scribe lines) and other scribe processes. The thickness of the substrate is more preferably in a range between 80 μm and 100 μm, and most preferably in a range between 85 μm and 100 μm.

When the substrate is too thick, scribing processes cannot be carried out without forming non-functional devices. When the substrate is too thin, the substrate is too weak to endure the necessary washing and scribing processes.

By forming the reflective layer using at least one metal selected from rhodium (Rh), ruthenium (Ru), platinum (Pt), gold (Au), palladium (Pd), chromium (Cr), nickel (Ni), cobalt (Co), titanium (Ti), indium (In), molybdenum (Mo), and their alloys, the device can effectively provide the effect described above.

Rhodium (Rh) has a relatively high reflectivity, although somewhat lower than silver (Ag) and aluminum (Al), and is useful for forming the reflective layer. In particular, because rhodium (Rh) is harder than silver (Ag) and aluminum (Al), the scribing cutter does not become clogged as easily as with one of the softer metals. Accordingly, by forming the reflective layer from rhodium (Rh), the scribing process can be improved.

Also, rhodium (Rh), ruthenium (Ru), platinum (Pt), gold (Au), nickel (Ni), cobalt (Co), and palladium (Pd), have comparatively good corrosion resistance and can be useful if the preferred corrosion-resistant layer is not formed.

Further, because Rhodium (Rh), ruthenium (Ru), nickel (Ni), and cobalt (Co) also exhibit comparatively good adhesion to the substrate, they are useful if the preferred light transmission layer is not formed on the wafer. For example, as an alternative to the light transmission layer or a portion of the reflection layer, about 15 Å of a metal layer comprising rhodium (Rh) can be formed as the first layer of the laminated reflective layer. By applying an alternative layer such as rhodium (Rh) which has a comparatively high reflectivity, the reflectivity of final mirror structure is not degraded and the resistance of mirror layer to delamination from the substrate can be improved.

Because gold (Au) has a higher reflectivity than aluminum (Al) to red light, it is useful for forming the reflection layer in a semiconductor light-emitting device which emits light of comparatively longer wavelength.

Because rhodium (Rh), ruthenium (Ru), platinum (Pt), gold (Au), and their alloys do not tend to react strongly with atmospheric gases during deposition or sputtering processes, those metals can also be used to construct a mirror structure having high reflectivity without forming an underlying light transmission layer.

By forming layers in the mirror structure, such as the light transmission layer, and/or the reflective layer, and/or the corrosion-resistant layer, in sequence by sputtering or depositing only after forming the split lines, the split line formation process can be improved.

After the light transmission layer is formed, the adhesive materials from the adhesive sheet do not volatilize and form unwanted gases. That is because, as explained later in reference to FIG. 6, the surface of the adhesive sheet where adhesive materials are exposed is covered by the light transmission layer materials during the subsequent deposition and sputtering processes. As a result, the adhesive materials do not volatilize additional gases and gases volatilized from the adhesive materials during the formation of the light transmission layer have been exhausted, those gases are not present to combine chemically with the metals which are being deposited and sputtered to form the reflective layer. Accordingly, excellent reflectivity of the metal layer (the reflective layer) which is subsequently deposited on the light transmission layer can be maintained.

For the above described reasons, the process for forming split lines (scribe lines) on the reverse side of the semiconductor wafer (the reverse side of the substrate) before forming the mirror structure (the reflective layer) is improved.

The thickness of the light transmission layer can be in a range between 5 nm and 10 $\mu$m. Although it may depend on the kind of material(s) constituting the layer, the thickness of the light transmission layer is more preferably in a range between 15 nm and 500 nm, and most preferably in a range between 20 nm and 300 nm. When the light transmission layer is too thin, the surface of the adhesive sheet where adhesive materials are exposed is not sufficiently covered and gas generation cannot be prevented. As a result, metals being deposited on the light transmission layer chemically combine with the gases released from beneath the light transmission layer. When this reaction occurs, the reflectivity of the mirror structure deteriorates and the adhesion between the mirror structure and the substrate decreases.

When the layer is too thick, its luminous transparency is decreased and too much material, processing time and other resources are required to form the layer, thereby unnecessarily increasing the cost of forming the light transmission layer.

By carrying out the breaking process to divide the semiconductor wafer into individual light-emitting semiconductor devices, the production of merchandise such as light-emitting devices becomes possible. Alternatively, the breaking process can be omitted. For example, a purchaser of an undivided semiconductor wafer may choose to carry out its own process to divide the wafers into separate light-emitting semiconductor devices.

The substrate on which semiconductor crystals grow may comprise materials such as sapphire, spinel, silicon, silicon carbide, zinc oxide, gallium phosphide, gallium arsenide, magnesium oxide, manganese oxide, lithium gallium oxide ($LiGaO_2$), and molybdenum sulfide (MoS).

Although it depends on other conditions such as the width of the separation grooves, the kinds and thicknesses of materials formed on the substrate, and the thickness of the substrate after carrying out the lamellar process, the depth of the separation grooves formed on the substrate is, for example, about 1/30 to about 1/2 of the thickness of a sapphire substrate. More preferably, the depth of the separation grooves may be around 5–15% of the substrate thickness. When the separation grooves are too deep, the semiconductor wafer will be more prone to fail, e.g., form partial cracks during the formation of the separation grooves, the lamellar process, or the scribing process. These cracks in turn prevent the wafer from being divided cleanly into the desired individual light-emitting devices and increase the number of defective units. When the depth of the separation grooves is too shallow, the wafer may not be easily or cleanly divided during the breaking process to produce the desired individual devices.

These effects can be seen in an LED comprising semiconductor layers which comprise binary, ternary or quaternary semiconductor compounds satisfying the formula $Al_xGa_yIn_{1-x-y}N$ ($0 \leqq x \leqq 1$, $0 \leqq y \leqq 1$, $0 \leqq x+y \leqq 1$), such as a light-emitting device using a group III nitride compound semiconductor. Alternatively, a portion of the group III elements may be replaced with boron (B) or thallium (Tl), and a portion or all of nitrogen (N) may be replaced with phosphorous (P), arsenic (As), antimony (Sb), or bismuth (Bi).

First Embodiment

Figure 14:
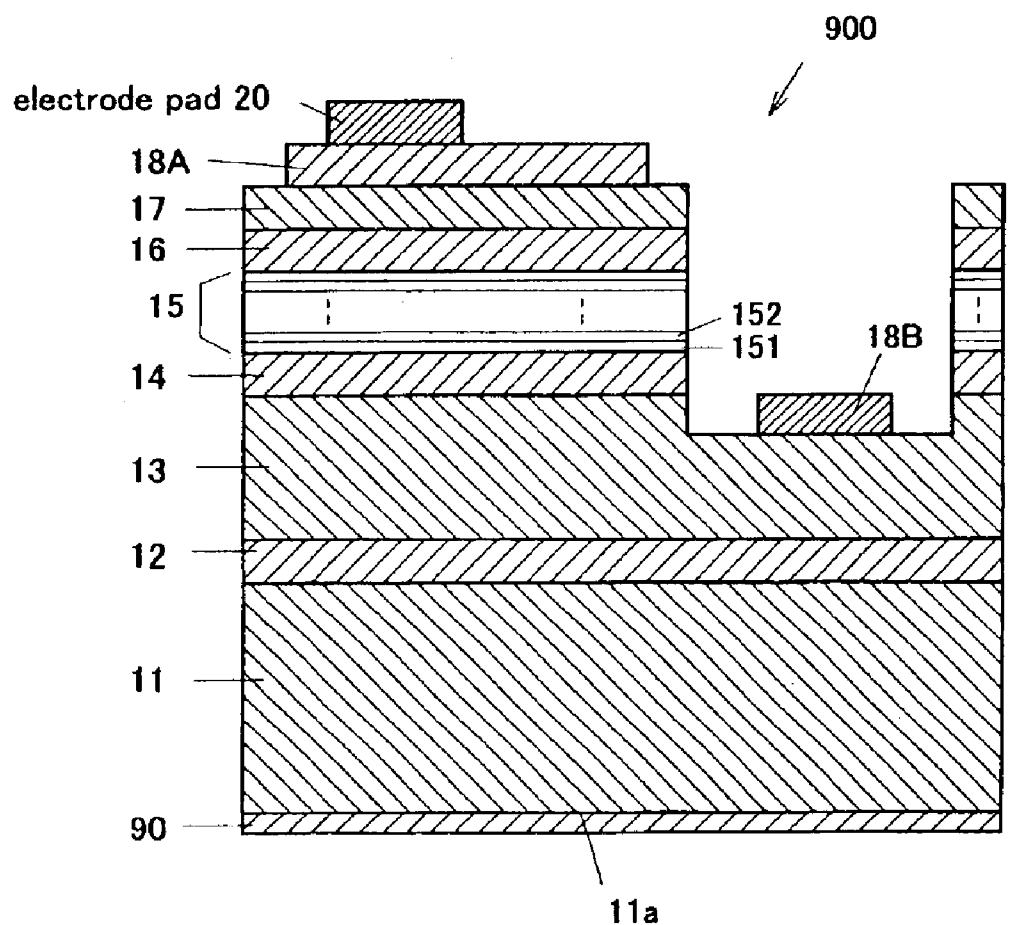
FIG. 14 is a cross-sectional view of a conventional light-emitting device 900 using a group III nitride compound semiconductor.

FIG. 1 is a cross-sectional view showing the structure of a light-emitting device 100 using group III nitride compound semiconductor (hereinafter referred to as a light-emitting semiconductor device 100 or simply as a device 100). The light-emitting device 100 has almost the same structure as that of a conventional light-emitting semiconductor device 900 shown in FIG. 14, but the light-emitting device 100 further comprises a mirror structure 10 for reflecting light formed on the reverse side of a substrate 11.

The structure of the light-emitting semiconductor device 100 of the present invention is described more fully below.

The light-emitting semiconductor device 100 comprises a substrate 11, preferably formed into an approximately square shape. On the substrate 11, a buffer layer 12 consisting of aluminum nitride (AlN), which has a thickness of about 25 nm, and an $n^+$-layer (an n-type contact layer) 13 having a high carrier concentration consisting of silicon (Si) doped GaN, which has a thickness of about 4.0 $\mu$m, are formed in sequence. An additional layer of about 0.5 $\mu$m of Si-doped GaN is then formed as an n-type clad layer 14 on the $n^+$-layer (n-type contact layer) 13.

An emission layer 15 having a multiple quantum well (MQW) structure is then formed on the n-type clad layer 14. The emission layer 15 comprises 6 barrier layers 151, each of which has a thickness of about 35 Å and consists of GaN, and 5 well layers 152, each of which has a thickness of about 35 Å and consists of $Gao_{0.8}Ino_{0.2}N$, alternately formed. About 50 nm of a p-type $Al_{0.15}Gao_{0.85}N$ is then formed on the emission layer 15 as a p-type clad layer 16. About 100 nm of a p-type GaN is then formed on the p-type clad layer 16 to act as a p-type contact layer 17.

A light-transmitting positive electrode 18A is then formed by depositing metal on the p-type contact layer 17 and a negative electrode 18B is formed on the $n^+$-layer 13. The positive electrode 18A is constructed from about 15 Å of cobalt (Co), which contacts the p-type contact layer 17, and about 60 Å of gold (Au) , which is formed on the cobalt (Co). The negative electrode 18B is constructed from about 200 Å of vanadium (V) and about 1.8 $\mu$m of aluminum (Al) or an aluminum alloy. An electrode pad 20 having a thickness of about 1.5 μm is then formed on the positive electrode 18A. The electrode pad 20 is preferably made from cobalt (Co), nickel (Ni), gold (Au), aluminum (Al), or an alloy including at least one of these metals.

A mirror structure 10 is then formed on the reverse side of the substrate 11. Its structure and laminating process are explained in more detail below with reference to FIGS. 8 and 11).

A method for manufacturing the light-emitting device 100 according to the present invention includes the following steps.

Each of the layers of the light-emitting device 100 is formed by gaseous phase epitaxial growth, called metal organic vapor phase deposition (hereinafter MOVPE). The gases employed in this process were ammonia ($NH_3$), a carrier gas ($H_2$ or $N_2$), trimethyl gallium ($Ga(CH_3)_3$) (hereinafter TMG), trimethyl aluminum ($Al(CH_3)_3$) (hereinafter TMA), trimethyl indium ($In(CH_3)_3$) (hereinafter TMI), silane ($SiH_4$), and biscyclopentadienyl magnesium ($Mg(C_5H_5)_2$) (hereinafter $CP_2Mg$)

The single crystal sapphire substrate 11 was placed on a susceptor in a reaction chamber for the MOVPE treatment after its main surface 'a' has been cleaned by an organic washing solvent and heat treatment. Then the sapphire substrate 11 was baked at 1100° C. in $H_2$ vapor fed into the chamber for 30 minutes under normal pressure.

About 25 nm of AlN buffer layer 12 was then formed on the surface of the baked sapphire substrate 11 under conditions controlled by lowering the temperature in the chamber to 400° C., keeping the temperature constant, and concurrently supplying $H_2$, $NH_3$, and TMA.

About 4.0 μm of GaN was then formed on the buffer layer 12, as an $n^+$-layer 13 having a high carrier concentration comprising an electron concentration of at least about $2\times10^{18}/cm^3$, under conditions controlled by keeping the temperature of the sapphire substrate 11 at 1150° C. and concurrently supplying $H_2$, $NH_3$, TMG, and silane.

About 0.5 μm of GaN was then formed on the $n^+$-layer 13, to form clad layer 14, having a lower electron concentration of about $1\times10^{18}/cm^3$, under conditions controlled by keeping the temperature of the sapphire substrate 11 at 1150° C. and concurrently supplying $N_2$ or $H_2$, $NH_3$, TMG, TMA, and silane.

Then about 35 Å A of a barrier layer 151 consisting of GaN was formed under conditions controlled by concurrently supplying $N_2$ or $H_2$, $NH_3$, and TMG. And about 35 Å in thickness a well layer 152 consisting of $Ga_{0.8}In_{0.2}N$ was then formed on the barrier layer 151 under conditions controlled by concurrently supplying $N_2$ or $H_2$, $NH_3$, TMG, and TMA. Similarly, four additional pairs comprising a barrier layer 151 and a well layer 152 were formed in sequence under the same respective conditions. A sixth barrier layer 151 consisting of GaN was then formed on the well layer 152 of the fifth pair. Accordingly, an emission layer 15 having a multiple quantum well (MQW) structure with five periods was formed.

About 50 nm of Mg-doped p-type $Al_{0.15}Ga_{0.85}N$ was then formed on the emission layer 15, to produce a clad layer 16, under conditions controlled by keeping the temperature of the substrate 11 at 1100° C. and concurrently supplying $N_2$ or $H_2$, $NH_3$, TMG, TMA, and $CP_2Mg$.

About 100 nm of Mg-doped p-type GaN was then formed on the clad layer 16, to form a contact layer 17, under conditions controlled by keeping the temperature of the substrate at 1100° C. and concurrently supplying $N_2$ or $H_2$, $NH_3$, TMG, and $CP_2Mg$.

An etching mask was then formed on contact layer 17, and predetermined regions of the mask were removed. Then the exposed portions of the contact layer 17, the clad layer 16, the emission layer 15, the clad layer 14, and some part of the $n^+$-layer 13 were etched by reactive ion etching using a gas including chlorine (Cl). Accordingly, a portion of the $n^+$-layer 13 was exposed.

Then an electrode 18A and a light-transmitting electrode 18B were formed on the $n^+$-layer 13 and the contact layer 17, respectively, as follows.

(1) A photoresist layer was formed on the $n^+$-layer 13. A window was formed on a predetermined region of the exposed surface of the $n^+$-layer 13 by patterning using photolithography. After exhausting a deposition chamber to a high vacuum of at least $10^{-6}$ Torr, about 200 Å of vanadium (V) and about 1.8 μm of aluminum (Al) were deposited on the window and the remaining photoresist. The photoresist layer on the $n^+$-layer 13 was then removed. Accordingly, the electrode 18B was formed on the exposed surface of the $n^+$-layer 13.

(2) A second photoresist layer was formed on the contact layer 17. The photoresist layer over the electrode forming portion of contact layer 17 was then removed by patterning using photolithography to form a window.

(3) After exhausting a deposition chamber to a high vacuum lower than $10^{-6}$ Torr, about 15 Å of cobalt (Co) and about 60 Å of gold (Au) were formed in sequence on the photoresist layer and the exposed surface of the contact layer 17.

(4) The wafer was taken from the deposition reaction chamber and the cobalt (Co) and gold (Au) laminated on the photoresist layer were removed using a lift-off process, leaving electrode 18A on the contact layer 17.

(5) To form an electrode pad 20 to improve subsequent bonding, a window was formed in another photoresist layer to expose a portion of electrode 18A. About 1.5 μm of at least one of cobalt (Co) or nickel (Ni), and at least one of gold (Au), aluminum (Al), or an alloy including at least Au or Al were deposited on the photoresist layer and in the window. Then, as in the formation of electrode 18A, the metal film formed on the photoresist layer was removed using a lift-off process to leave electrode pad 20.

(6) After the atmosphere of the chamber was exhausted by a vacuum pump, $O_2$ gas is supplied until the pressure reached about 3 Pa. Under conditions controlled by keeping the pressure constant and keeping the temperature of the atmosphere about 550° C., the sample was heated for about 3 minutes. Accordingly, the contact layer 17 and the clad layer 16 were converted to lower resistance p-type layers, and the contact layer 17, the electrode 18A, the $n^+$-layer 13 and electrode 18B, respectively, are alloyed.

Using the process represented by steps (1) to (6), a semiconductor wafer 200 which does not have a mirror structure was formed.

The processes of forming the mirror structure and separating the wafer into light-emitting semiconductor devices 100 are explained below with reference to FIGS. 2–8.

Figure 2:
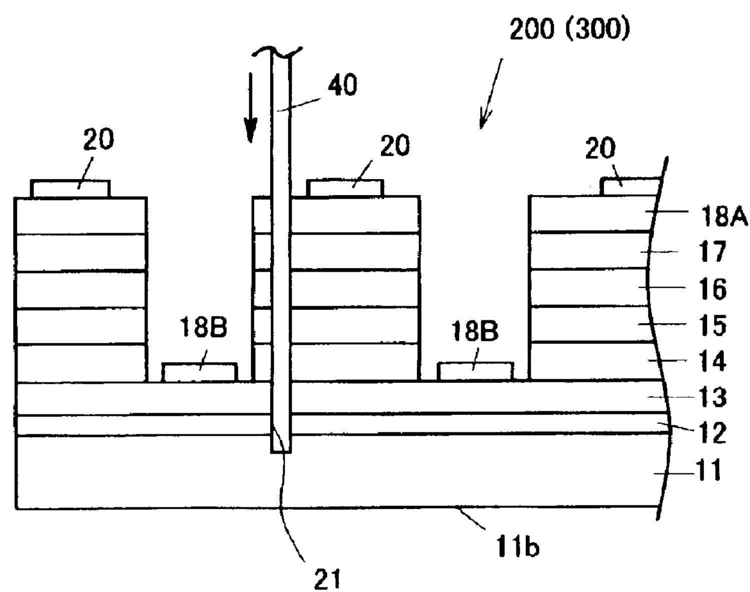
FIG. 2 is a cross-sectional view showing a process of forming separation grooves in a semiconductor wafer 200 in accordance with first and second embodiment of the present invention.

FIG. 2 is a cross-sectional view of the semiconductor wafer 200 showing a process of forming separation grooves. As shown in FIG. 2, a separation groove 21, which has a depth sufficient to reach into the substrate 11, was formed by dicing the semiconductor wafer 200 using a blade 40 (a process of forming a separation groove). The depth of the separation groove 21 into the substrate 11 (the depth from the main surface of the substrate) may be in a range between 6 μm and 15 μm. In this embodiment, the depth is adjusted to be about 10 μm.

Figure 3:
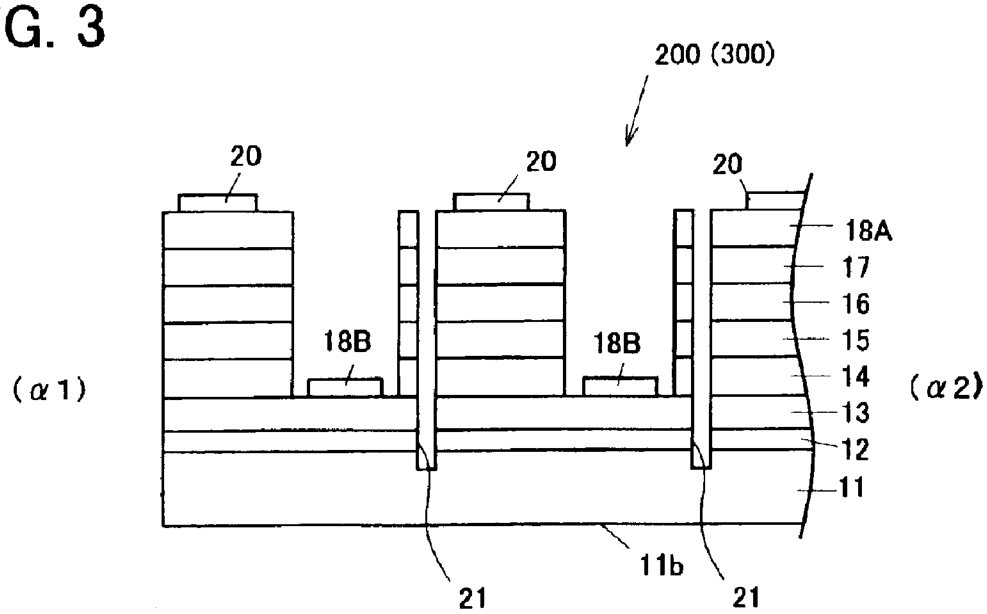
FIG. 3 is a cross-sectional view showing a lamellar process of the semiconductor wafer 200 in accordance with first and second embodiment of the present invention.
Figure 4:
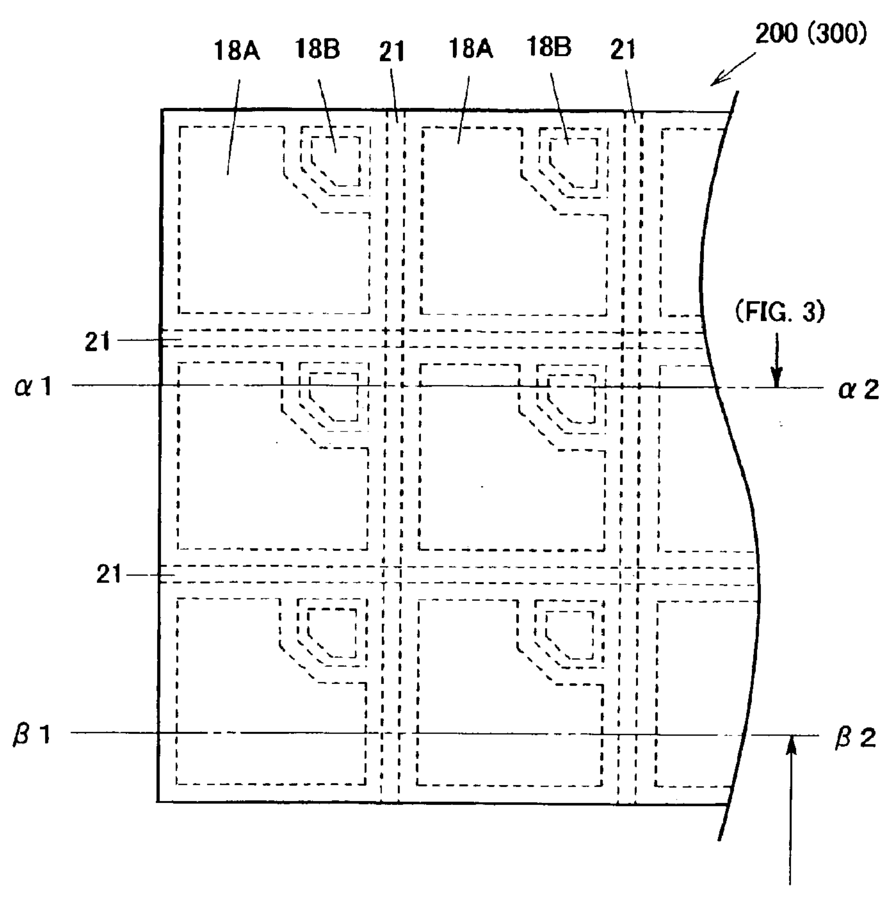
FIG. 4 is a plan view showing the semiconductor wafer 200 or 300 from a substrate (11*b*) side after the lamellar process in accordance with first and second aspects of the present invention.

The reverse side 11*b* of the substrate 11 formed in the semiconductor wafer 200 was then polished using a polishing machine until the substrate 11 become a lamella its thickness has been substantially reduced. Accordingly, a wafer whose sectional and plan views are shown in FIGS. 3 and 4, respectively, can be obtained. As shown in FIG. 4, because the portion of the substrate 11 on which the separation groove 21 is formed is thinner than other portions of the substrate 11, the separation groove 21 can be recognized visually from the reverse side 11*b* of the substrate 11. Here FIGS. 3 and 4 are a schematic cross-sectional view and a schematic plan view from the substrate side (from the reverse side 11*b*).

Figure 5:
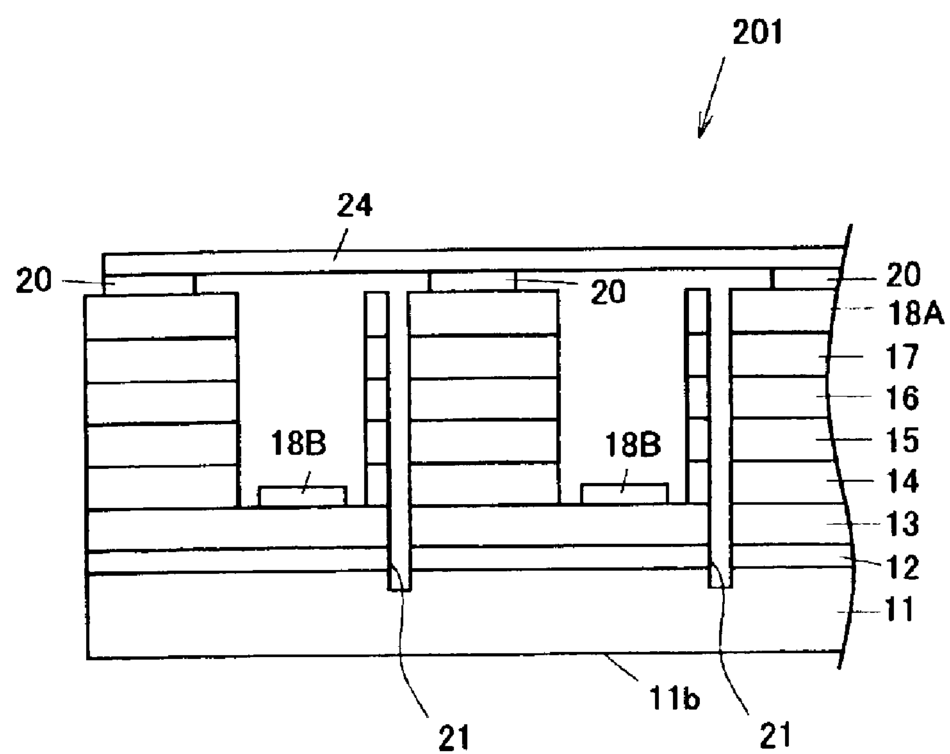
FIG. 5 is a cross-sectional view of a semiconductor wafer 201 showing an adhering process in accordance with the first embodiment of the present invention.
Figure 6A:
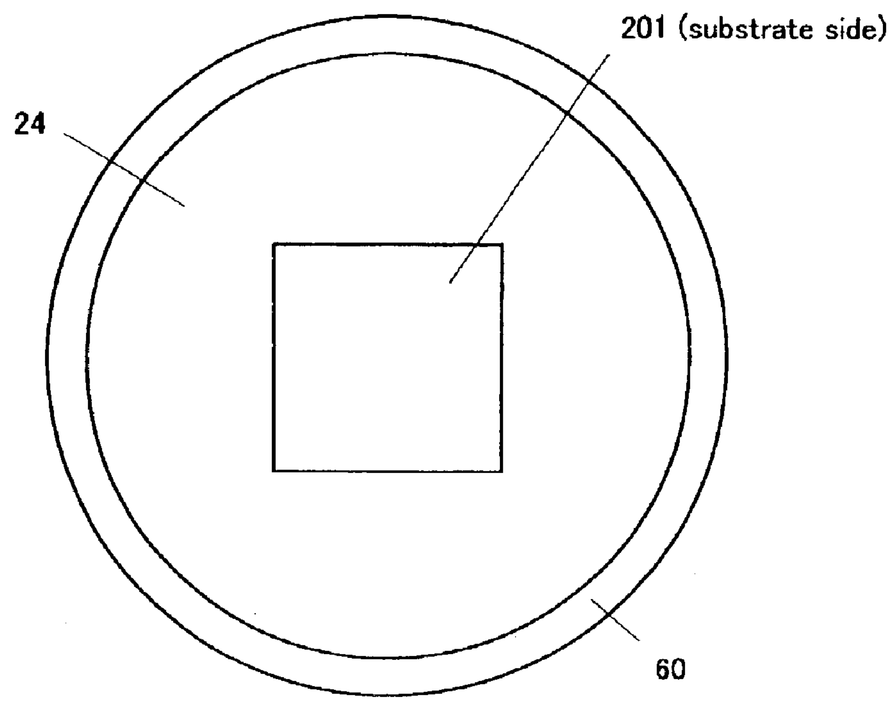
FIGS. 6A and 6B are plan views showing the adhering process and a scribing process in accordance with the first embodiment of the present invention.

An adhesive sheet 24 which is supported by support ring 60 preferably made of stainless steel was then adhered on the electrode side of the wafer. Accordingly, a wafer whose cross-sectional and plan views are shown in FIGS. 5 and 6A, respectively, can be obtained. Here FIG. 5 is a schematic cross-sectional view of the semiconductor wafer 200 which comprises the adhesive sheet 24 after the adhering process (referred to as a semiconductor wafer 201) and FIGS. 6A and 6B are schematic plan views of the semiconductor wafer 201 from the substrate side which explains the adhering process and the scribing process.

Figure 6B:
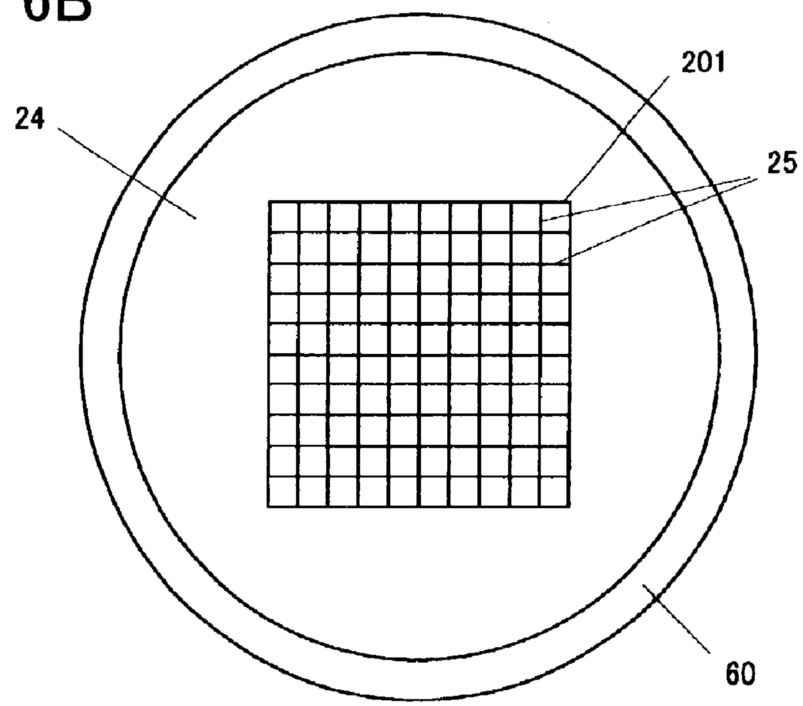
Figure 7:
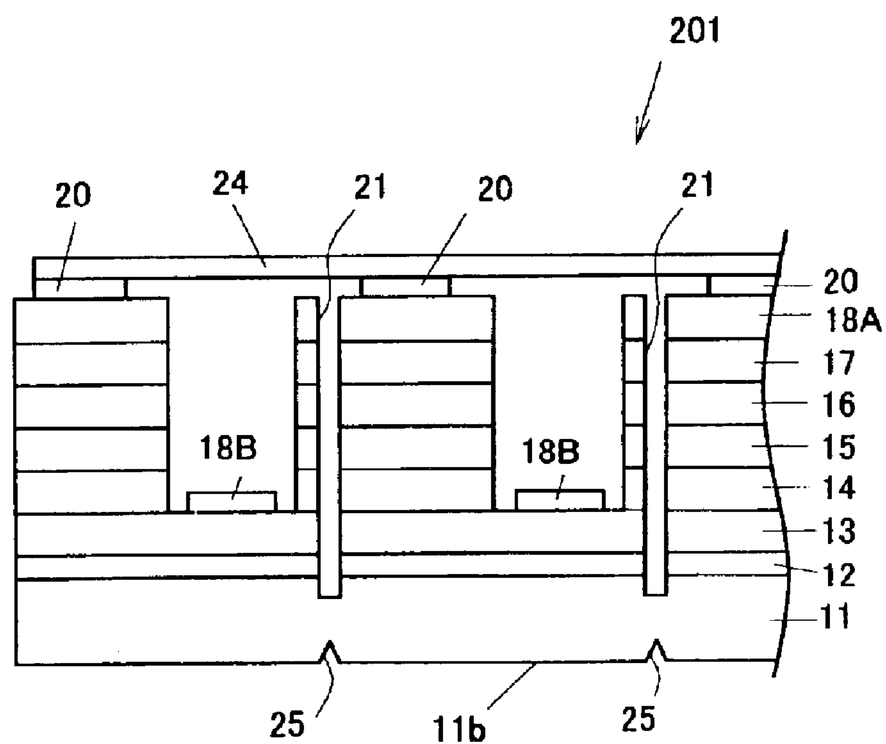
FIG. 7 is a cross-sectional view of the semiconductor wafer 201 showing the scribing process in accordance with the first embodiment of the present invention.

As shown in FIG. 6B, split lines 25 were formed by scribing the reverse side 11*b* of the substrate 11 opposite and along the separation grooves 21. FIG. 7 is a cross-sectional view of the semiconductor wafer 201 after forming the split lines 25 via the scribing process.

Then, by following the process described below, a mirror structure 10 was formed by sequentially laminating a light transmission layer 101, a reflective layer 102, and a corrosion-resistant layer 103 on the reverse side 11*b* of the substrate 11.

(Execution Condition for Sputtering)

(1) a light transmission layer 101 (about 30 nm of $Al_2O_3$)

(a) sputtering type: RF sputtering (100W)

(b) ultimate degree of vacuum in the atmosphere of a sputtering chamber: $2\times10^{-4}$Pa (c) gas pressure of inert gases used for pressure: $4\times10^{-1}$Pa (Ar gas)

(2) a reflective layer 102 (about 300 nm of Al)

(a) sputtering type: DC sputtering (200 mA, 380V)

(b) ultimate degree of vacuum in the atmosphere of a sputtering chamber: $2\times10^{-4}$Pa (c) gas pressure of inert gases used for pressure: $4\times10^{-1}$Pa (Ar gas)

(3) a corrosion-resistant layer 103 (about 100 nm in thickness of $Al_2O_3$)

(a) sputtering type: RF sputtering (100W)

(b) ultimate degree of vacuum in the atmosphere of a sputtering chamber: $2\times10^{-4}$Pa (c) gas pressure of inert gases used for pressure: $4\times10^{-1}$Pa (Ar gas)

Figure 8:
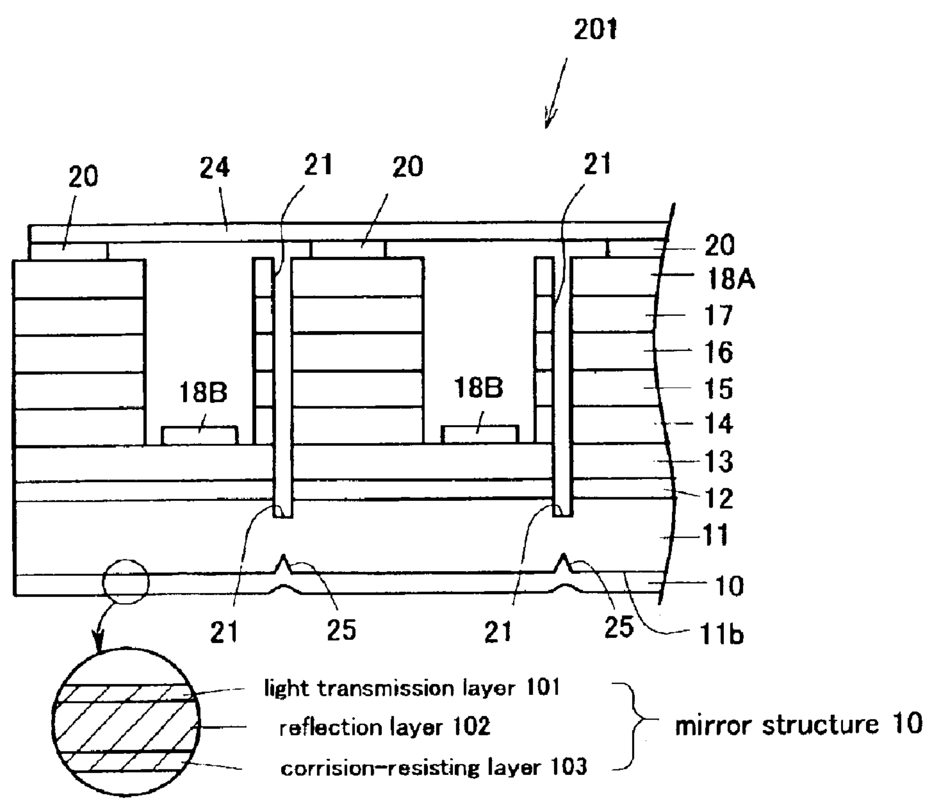
FIG. 8 is a cross-sectional view of the semiconductor wafer 201 showing a process of forming a mirror structure in accordance with the first embodiment of the present invention.

Accordingly, the mirror structure 10 shown in FIG. 8 can be obtained. FIG. 8 is a schematic cross-sectional view of the semiconductor wafer 201 after forming the mirror structure.

The wafer was then divided into individual chips by mechanically loading the wafer near the split line to break the wafer and separate the light-emitting devices shown in FIG. 1.

By forming the mirror structure 10 on the reverse side of the substrate 11, deterioration of the reflectivity of the reflective layer 102 can be prevented. As a result, light emitted downwardly from emission layer 15 can be reflected effectively to provide a high luminous intensity. For example, luminous intensity of the light-emitting device 100 manufactured by applying the method described above is about 130% of that achieved by a conventional light-emitting semiconductor device which does not have a mirror structure formed on the reverse side of its substrate.

FIG. 9 is a table showing characteristics of a light-emitting device 100 using a group III nitride compound semiconductor device corresponding to wafer 201 as shown in FIG. 8 after applying electricity continuously for a given period. Here luminous intensity maintenance rate (%) represents a ratio (percentage) of the luminous intensity of the light-emitting semiconductor device 100 after applying electricity continuously to the initial luminous intensity of the device 100. As shown in the table of FIG. 9, after applying electricity continuously for 500 hours, the luminous intensity of the light-emitting device 100 according to the present invention which comprises the mirror structure 10 is larger than that of the light-emitting device 900 which comprises a conventional mirror structure 90.

Unlike the above embodiment, the light transmission layer 101, the reflection layer 102, and the corrosion-resistant layer 103 can be formed after separation of the light-emitting devices if so desired.

Second Embodiment

In this embodiment, a method for manufacturing a light-emitting device 100 using a group III nitride compound semiconductor, which is shown in FIG. 1, from a semiconductor wafer 300 shown in FIG. 4 is explained.

FIG. 4 is a plan view of the semiconductor wafer 300 viewed from the substrate side (11*b*) after carrying out the polishing process. The semiconductor wafer 300 is the same as the semiconductor wafer 200 in the first embodiment.

The semiconductor wafer 300 was cleaned using an organic washing solvent such as acetone, IPA, etc. with the temperature of the surface of the substrate being raised to about 150° C.

Figure 10A:
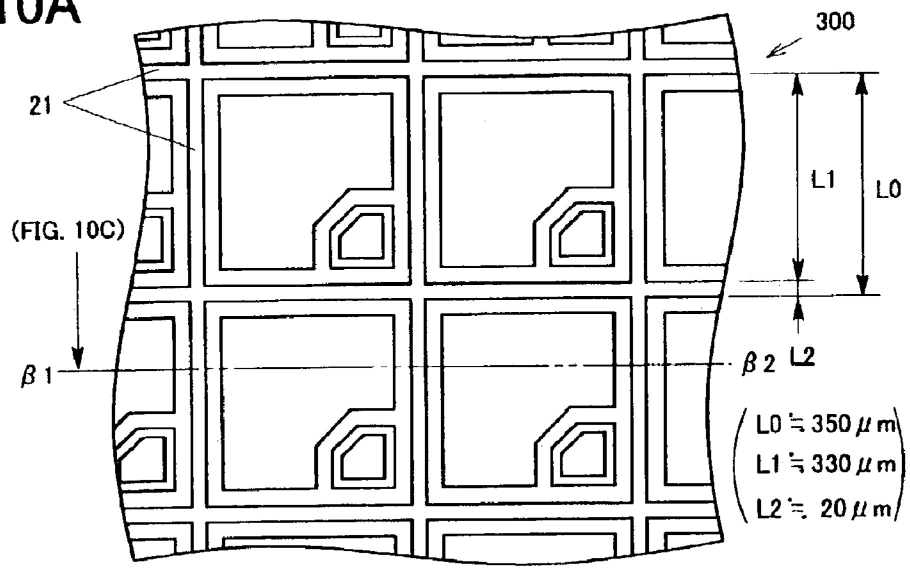
FIGS. 10A and 10B are plan views of a semiconductor wafer 300 showing processes of forming mask and the mirror structure in accordance with the second embodiment of the present invention.
Figure 10B:
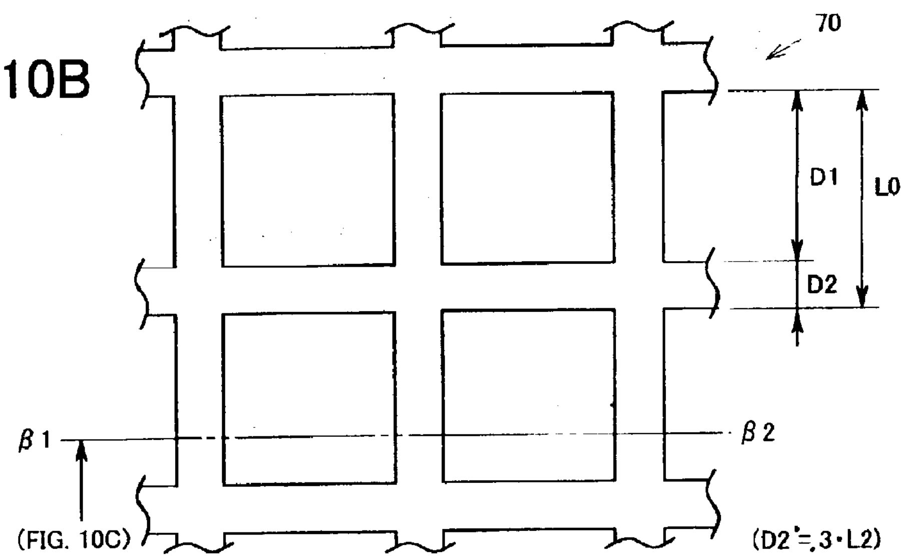
Figure 10C:
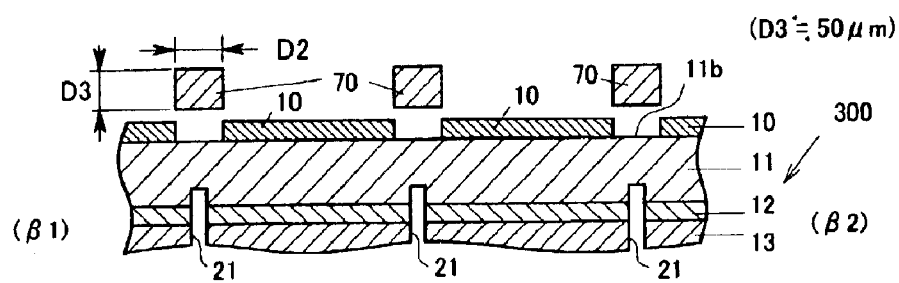
FIG. 10C is a cross-sectional view of the semiconductor wafer 300 showing processes of forming the mask and the mirror structure in accordance with the second embodiment of the present invention.

FIGS. 10A–10C are views showing a process for forming a mask. FIGS. 10A and 10B are plan views and FIG. 10C is a cross-sectional view of the semiconductor wafer 300 showing processes of forming a mask and the mirror structure.

As shown in FIG. 10A, the light-emitting device 100 using a group III nitride compound semiconductor, which is to be separated from the semiconductor wafer 300, is formed in an approximate square each of whose edges (L1) is about 330 μm.

An attached mask 70 made of stainless steel formed in a reticular grid pattern shown in FIG. 10B. A width D2 of the striped parts of this grid pattern which are masked by the attached mask 70 is three times as large as a width L2 of the striped parts of the separation groove 21.

As shown in FIG. 10C, the attached mask 70 is positioned approximately parallel to the reverse side 11*b* of the substrate 11. Also, the center lines of the width D2 of the striped parts of the attached mask 70 approximately correspond to that of the width L2 of the separation grooves 21. Accordingly, the process of forming the mask is carried out.

A distance between the reverse side 11*b* of the substrate 11 and the attached mask 70 may be determined according to the thickness, materials, etc. of the mirror structure 10 to be formed thereon. Alternatively, the distance between the reverse side 11*b* and the attached mask 70 can be about 0 μm (in contact). Alternatively, the temperature of the surface of the substrate 11 can be raised by supplying electric current to the attached mask 70 to heat it. The temperature of the surface of the substrate 11 need not, however be raised.

Figure 11:
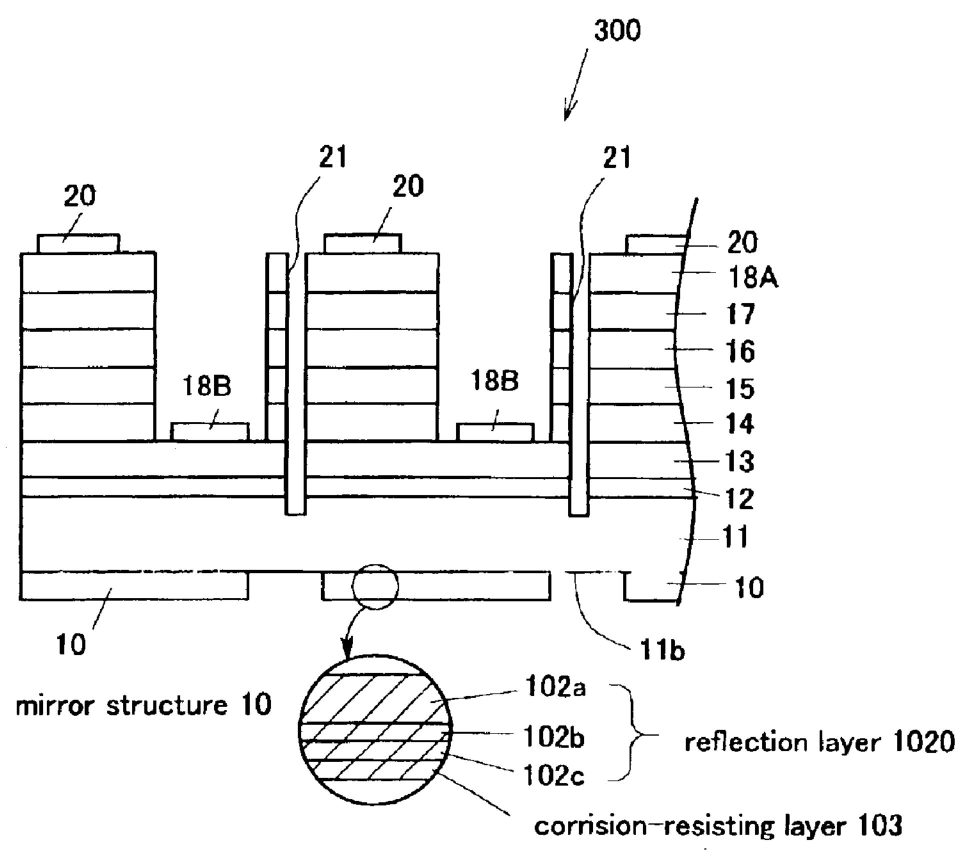
FIG. 11 is a cross-sectional view of the semiconductor wafer 300 showing the process of forming the mirror structure in accordance with the second embodiment of the present invention.

FIG. 11 is a schematic cross-sectional view of the semiconductor wafer 300 after the process of forming the mirror structure which includes the masking process explained above. The reflective layer 1020 preferably has a multiple layer structure comprising about 900 Å of Ag layer 102*a*, about 300 Å of Ni/Mo layer 102*b*, and about 3000 Å of Au layer 102*c*. These metal layers are preferably formed by carrying out sequential electron beam depositions.

A corrosion-resistant layer 103 was formed under almost the same conditions as that explained in the first embodiment. The corrosion-resisting layer 103 of this embodiment is, however, optional.

For a mirror structure 10 having the structure described in this embodiment, the reflectivity of a reflective layer saturates when the thickness of the reflective layer is in a range of about 800 Å to 1000 Å. As a result, sufficiently high reflectivity and excellent corrosion resistance can be obtained at the same time. That is, the mirror structure 10 of the second embodiment can obtain almost the same degree of high reflectivity and excellent corrosion resistance as the mirror structure 10 of the first embodiment.

Figure 12:
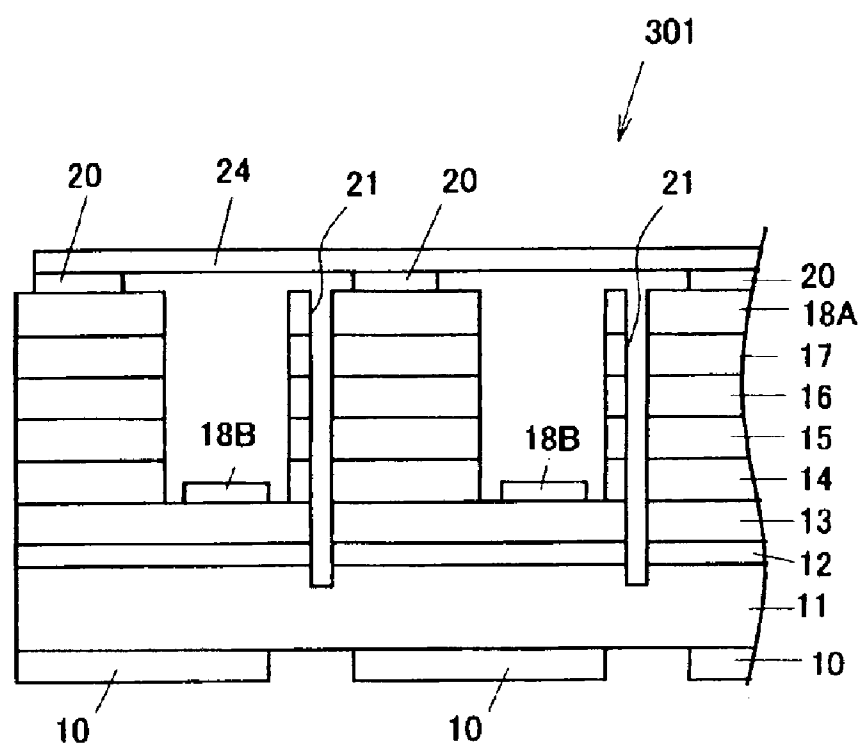
FIG. 12 is a cross-sectional view of a semiconductor wafer 301 showing an adhering process in accordance with the second embodiment of the present invention.

After carrying out the same adhesion process as in the first embodiment, a semiconductor wafer 301 comprising an adhesive sheet 24 whose cross-sectional view is shown in FIG. 12 was obtained.

Figure 13:
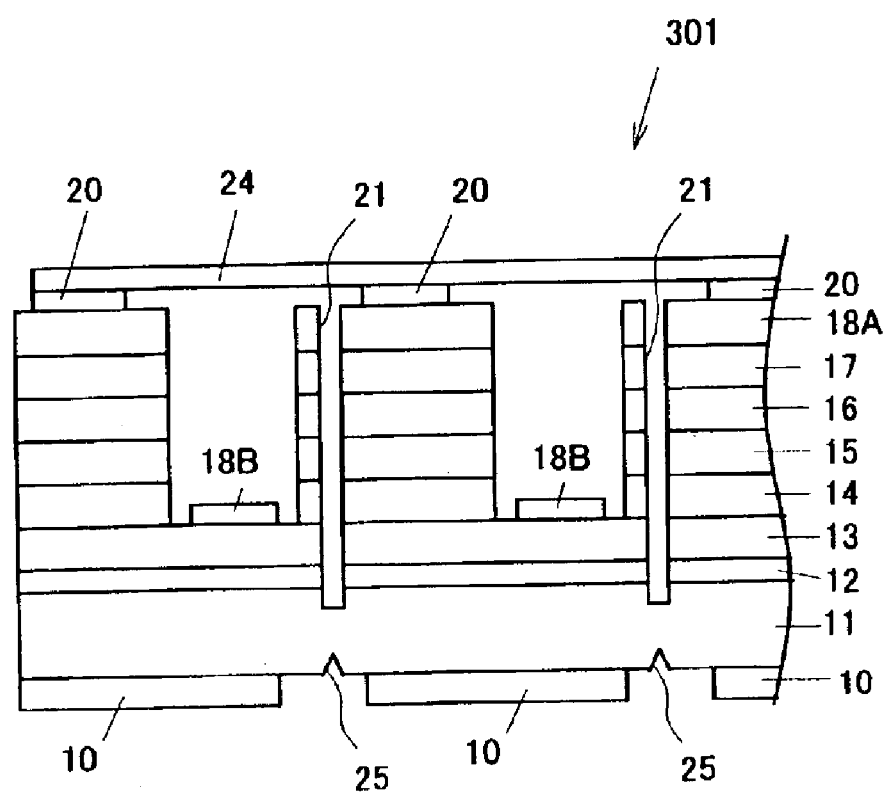
FIG. 13 is a cross-sectional view of the semiconductor wafer 301 showing a scribing process in accordance with the second aspect of the present invention.

Then the same scribing process as described in the first embodiment is carried out, and a semiconductor wafer 301 comprising a split lines 25 whose cross-sectional view is shown in FIG. 13 was obtained.

Then, the wafer was divided into chips by mechanically loading the wafer near the split lines to break the wafer and separate the light-emitting devices shown in FIG. 1.

Accordingly, by forming the mirror structure 10 on the reverse side of the substrate 11, the reflectivity of the reflective layer 1020 (especially the layer 102*a* which is the main layer for reflecting the emitted light) can be prevented from deteriorating. As a result, light emitted from the emission layer 15 can be reflected effectively to maintain high luminous intensity over extended periods.

Because the mirror structure 10 is not formed on the portions where the split lines will be later formed, the separation groove 21 can be recognized visually from the mirror structure side (reverse side) of the semiconductor wafer during the scribing process. Thus scribing after forming the mirror structure on the reverse side of the substrate 11 becomes easy. Also, dividing the semiconductor wafer 301 into pieces of device 100 becomes easy because of the split line.

In the second embodiment, an adhesive sheet is not used in the process of forming the mirror structure. Because of this, washing and heating the semiconductor wafer 300 at this stage becomes possible. And because an adhesive sheet is not adhered, unwanted gases cannot be volatilized during mirror formation. That enables the formation of a mirror structure having high reflectivity and adhesiveness without the need to form an underlying light transmission layer on the substrate.

A metal layer of about 1000 Å consisting of rhodium (Rh) can be formed in place of the multiple layer structure of reflective layer 1020. Rh exhibits excellent adhesion to the substrate and also provides comparatively good corrosion resistance and reflectivity. Thus, by forming a metal layer consisting of such metals, excellent adhesion and reflectivity can be obtained.

The attached mask consists of stainless steel having a thickness in a range of 20 $\mu$m to 500 $\mu$m. The thickness of the attached mask is more preferably in a range of about 30 $\mu$m to 300 $\mu$m, somewhat more preferably in a range of about 30 $\mu$m to 100 $\mu$m and most preferably around 50 $\mu$m. When the attached mask is too thin, the mask may be easily damaged thereby preventing its reuse. When the attached mask is too thick, the thickness of the mirror structure around a boundary of the edge of a region on which the mask is formed tends to become irregular and an accurately attached mask cannot be obtained.

The width of the striped parts of the grid pattern which are masked by the attached mask is preferably in a range about one to ten times that of the width of the striped parts of the separation groove. Although it may depend on the width of the separation groove, the width of the striped parts of the attached mask is preferably in a range of about two to five times larger than the width of the separation groove, and more preferably about three times larger than that of the separation groove. When the width of the striped parts masked by the attached mask is too large, the effective area of the mirror structure becomes narrower and the quantity of reflected lights decreases. When the width of the striped parts masked by the attached mask is too small, considerable accuracy is required for positioning the mask and, after the mirror structure is formed, the separation groove may be difficult to recognize from the reverse side thereby increasing the difficulty in positioning a scribing cutter precisely.

In the above embodiments, the emission layer 15 formed in the light-emitting device 100 has a multiple quantum well (MQW) structure. Alternatively, the emission layer 15 can have a single quantum well (SQW) structure, a single layer structure which comprises a layer consisting of materials such as $Ga_{0.8}In_{0.2}N$, quaternary or ternary AlGaIn having an arbitrary composition ratio, etc. In the embodiments, magnesium (Mg) is used as a p-type impurity. Alternatively, group II elements such as beryllium (Be) and zinc (Zn) can be used as a p-type impurity.

The present invention can be applied to a light-emitting device such as an LED and an LD. Also the present invention can also be applied to a light-receiving device.

While the invention has been described in connection with what are presently considered to be the most practical and preferred embodiments, it is to be understood that the invention is not to be limited to the disclosed embodiments but, on the contrary, is intended to cover various modifications and equivalent arrangements included within the spirit and scope of the appended claims.

What is claimed is:

1. A method for manufacturing a light-emitting device using a group III nitride compound semiconductor, comprising:

forming a light-emitting layer on a first side of a substrate;

forming separation grooves for separating the substrate into individual light-emitting semiconductor devices by cutting a light-emitting side of said substrate to a predetermined depth;

grinding or polishing the substrate to a predetermined thickness;

adhering said substrate to an adhesive sheet to expose a surface of the substrate;

scribing split lines on the exposed surface of the substrate to divide said substrate into individual light-emitting semiconductor devices; and after said scribing said split lines, forming a mirror structure on the exposed surface of the substrate, wherein said forming said mirror structure is carried out after said adhering said substrate to said adhesive sheet.

2. A method for manufacturing a light-emitting device using a group III nitride compound semiconductor, comprising:

forming a light-emitting layer on a first side of a substrate;

forming separation grooves for separating the substrate into individual light-emitting semiconductor devices by cutting a light-emitting side of said substrate to a predetermined depth;

grinding or polishing the substrate to a predetermined thickness;

adhering said substrate to an adhesive sheet to expose a surface of the substrate;

scribing split lines on the exposed surface of the substrate to divide said substrate into individual light-emitting semiconductor devices; and after said scribing said split lines, forming a mirror structure on the exposed surface of the substrate, wherein said forming said mirror structure comprises:

forming a light transmission layer directly on said substrate;

forming a reflective layer on said light transmission layer; and forming a corrosion-resistant layer on said reflective layer.

* * * * *